(12) United States Patent
Chen

(10) Patent No.: US 9,142,370 B2
(45) Date of Patent: Sep. 22, 2015

(54) ILLUMINATED KEYBOARD

(71) Applicant: Primax Electronics Ltd., Neihu, Taipei (TW)

(72) Inventor: Chung-Yuan Chen, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 125 days.

(21) Appl. No.: 13/801,542

(22) Filed: Mar. 13, 2013

(65) Prior Publication Data

US 2014/0138230 A1   May 22, 2014

(30) Foreign Application Priority Data

Nov. 21, 2012   (TW) .............. 101143416 A

(51) Int. Cl.

| | |
|---|---|
| *H01H 9/26* | (2006.01) |
| *H01H 13/72* | (2006.01) |
| *H01H 13/76* | (2006.01) |
| *H01H 13/83* | (2006.01) |
| *H03K 17/98* | (2006.01) |

(52) U.S. Cl.
CPC ............... *H01H 13/83* (2013.01); *H03K 17/98* (2013.01); *H01H 2219/044* (2013.01); *H01H 2219/06* (2013.01); *H01H 2219/062* (2013.01); *H01H 2221/028* (2013.01); *H01H 2239/006* (2013.01); *H03K 2217/9653* (2013.01)

(58) Field of Classification Search
CPC ......... H01H 9/26; H01H 13/72; H01H 13/76; H01H 13/70; H01H 25/00; H01H 25/04; H01H 1/52; H01H 3/20; H01H 9/00; H01H 5/00; H01H 2239/056; H01H 2219/036; H01H 2201/00
USPC .......... 200/324, 5 A, 5 R, 402, 512, 310–314, 200/341
See application file for complete search history.

(56) References Cited

U.S. PATENT DOCUMENTS

| | | | | |
|---|---|---|---|---|
| 7,151,528 | B2* | 12/2006 | Taylor et al. .................. | 345/168 |
| 7,608,792 | B1* | 10/2009 | Tsai .............................. | 200/310 |
| 7,841,791 | B2* | 11/2010 | Iso ............................... | 400/491.2 |
| 2010/0282581 | A1* | 11/2010 | Lin ............................... | 200/314 |
| 2014/0034472 | A1* | 2/2014 | Krumpelman et al. ........ | 200/5 A |

* cited by examiner

*Primary Examiner* — Edwin A. Leon
*Assistant Examiner* — Anthony R. Jimenez
(74) *Attorney, Agent, or Firm* — Kirton McConkie; Evan R. Witt

(57) ABSTRACT

An illuminated keyboard includes a keycap, a keycap guiding frame, a light guide plate and a sensing circuit layer, which are sequentially arranged from top to bottom. The keycap guiding frame is used for fixing the keycap and guiding movement of the keycap. The light guide plate is used for fixing the keycap guiding frame and transferring the light beam from a light-emitting element. As the keycap is depressed by the user, the approaching keycap is sensed by the sensing circuit layer, and thus the sensing circuit layer generates a corresponding non-contact key signal.

19 Claims, 8 Drawing Sheets

ILLUMINATED KEYBOARD

FIELD OF THE INVENTION

The present invention relates to a keyboard, and more particularly to an illuminated keyboard with an illuminating function.

BACKGROUND OF THE INVENTION

A keyboard is one of the widely-used computer peripheral devices. Via the keyboard, the user may input characters or commands into a computer. FIG. 1 is a schematic top view illustrating the outward appearance of a conventional keyboard. As shown in FIG. 1, the conventional keyboard 1 comprises plural keys 10. When one of these keys 10 is depressed by the user's finger, a corresponding signal is transmitted from the keyboard 1 to the computer, so that a corresponding key function is implemented by the computer. For example, by depressing the key 101, a corresponding English letter or a corresponding symbol is inputted into the computer. By depressing the key 102, a corresponding number is inputted into the computer. Moreover, by depressing the key 103, a corresponding programmed function is quickly executed.

With increasing development of science and technology, the keyboard manufacturers make efforts in designing novel keyboards with diversified functions in order to meet the requirements of different users. Recently, an illuminated keyboard with an illuminating function has been introduced into the market. Consequently, in a case that the illuminated keyboard is used in the dim environment with insufficient luminance, the characters marked on the keys of the illuminated keyboard are still clearly visible to the user.

Since the outward appearance of the conventional illuminated keyboard is similar to the outward appearance of the conventional keyboard 1, only the inner structure of the conventional illuminated keyboard will be illustrated in more details as follows. FIG. 2 is a schematic cross-sectional view illustrating a conventional illuminated keyboard.

Hereinafter, the components of the conventional illuminated keyboard will be illustrated with reference to FIG. 2. As shown in FIG. 2, the conventional illuminated keyboard 2 comprises at least one key 21, a membrane switch circuit module 22, a base plate 23, and a backlight module 24.

The key 21 comprises a keycap 211, an upward/downward supporting member 212 (e.g. a scissors-type supporting member), and an elastic element 213.

Moreover, the membrane switch circuit module 22 comprises an upper wiring plate 221 and a lower wiring plate 222. An upper contact 221a is formed on the upper wiring plate 221. Corresponding to the upper contact 221a, a lower contact 222a is formed on the lower wiring plate 222.

Moreover, the backlight module 24 comprises a light guide plate 241, a reflective plate 242, and a light-emitting element 243.

An assembling method and the operating principle of the conventional illuminated keyboard 2 will be illustrated in more details as follows. Firstly, both of the key 21 and the membrane switch circuit module 22 are disposed on the base plate 23, and the backlight module 24 is disposed under the base plate 23.

In particular, the upward/downward supporting member 212 of the key 21 is connected with the keycap 211 and the base plate 23. The elastic element 213 is disposed within the upward/downward supporting member 212, and arranged between the keycap 211 and the base plate 23. The membrane switch circuit module 22 is arranged between the elastic element 213 and the base plate 23.

As the key 21 is depressed, the keycap 211 is correspondingly moved with the upward/downward supporting member 212 in a vertical direction toward the base plate 23, and the membrane switch circuit module 22 is pushed by a protrusion part 213a within the elastic element 213. Under this circumstance, the upper contact 221a and the lower contact 222a of the membrane switch circuit module 22 are contacted with each other to be electrically conducted. Consequently, a corresponding input function is executed. Moreover, the elastic element 213 also provides an elastic force for allowing the keycap 213 to be moved upwardly or downwardly relative to the base plate 23.

Moreover, the light guide plate 241 is disposed under the base plate 23. The reflective plate 242 is disposed under the light guide plate 241. The light-emitting element 243 is located at a side of the light guide plate 241. The light-emitting element 243 is used for providing a light beam to illuminate the illuminated keyboard 2. After the light beam emitted by the light-emitting element 243 is incident into the light guide plate 241, the light beam is guided by the light guide plate 241 to be projected onto the base plate 23. Moreover, the light beam from the light-emitting element 243 may be reflected by the reflective plate 242, so that the light beam is transferred within the light guide plate 241 more uniformly.

From the above discussions, the keycap 211, the upward/downward supporting member 212, the elastic element 213, the membrane switch circuit module 22, the base plate 23, the light guide plate 241 and the reflective plate 242 of the conventional illuminated keyboard 2 are sequentially arranged and assembled from top to bottom.

However, the conventional illuminated keyboard 2 still has some drawbacks. For example, in the conventional illuminated keyboard 2, the base plate 23 is required to support the upward/downward supporting member 212, and the light guide plate 241 is required to transfer the light beam. Consequently, the overall thickness of the conventional illuminated keyboard 2 is increased. Moreover, during the light beam is transferred within the light guide plate 241 and projected upwardly onto the keycap 211, the light beam is firstly hindered by the circuit pattern of the membrane switch circuit module 22, so that a portion of the light beam is lost or the projecting direction of the light beam is changed. In addition, the light beam is then hindered by the upward/downward supporting member 212 or the elastic element 213, so that another portion of the light beam is lost or the projecting direction of the light beam is changed. Finally, the light beam which is projected onto the keycap 211 fails to be uniformly distributed and the luminance of the light beam is impaired.

Moreover, the elastic element 213 of the conventional illuminated keyboard 2 is mainly used to press the membrane switch circuit module 22 in order to make electrical connection between the upper contact 221a and the lower contact 222a. Consequently, the protrusion part 213a within the elastic element 213 is an essential component. Due to the protrusion part 213a, the shape of the elastic element 213 is restricted and fails to be changed at will. Due to the shape of the elastic element 213, the light beam is readily projected to other places instead of the keycap 211. Under this circumstance, the luminance of the keycap 211 is adversely affected.

Therefore, there is a need of providing an improved illuminated keyboard in order to eliminate the above drawbacks.

SUMMARY OF THE INVENTION

The present invention provides a slim-type illuminated keyboard.

In accordance with an aspect of the present invention, there is provided an illuminated keyboard. The illuminated keyboard includes at least one keycap, at least one light-emitting element, a light guide plate, a sensing circuit layer, and at least one keycap guiding frame. The at least one light-emitting element is used for providing a light beam to the keycap. The light guide plate is used for transferring the light beam from the light-emitting element. The sensing circuit layer is disposed under the light guide plate for generating at least one non-contact key signal. The at least one keycap guiding frame is disposed on the light guide plate for connecting the keycap and the light guide plate. The keycap guiding frame is contacted with the keycap for fixing the keycap and guiding movement of the keycap.

In an embodiment, the sensing circuit layer includes a first electrode layer, a second electrode layer and a first substrate. The first electrode layer and the second electrode layer are formed on the first substrate.

In an embodiment, the first electrode layer includes plural first electrode patterns, and the second electrode layer includes plural second electrode patterns. When the sensing circuit layer is electrically conducted, plural electric fields between the plural first electrode patterns and the plural second electrode patterns are generated. As the keycap is moved to a position near a corresponding electric field, the corresponding electric field is changed, so that the non-contact key signal is generated by the sensing circuit layer.

In an embodiment, the sensing circuit layer includes a first electrode layer, a second electrode layer, a second substrate and a third substrate. The first electrode layer and the second electrode layer are formed on the second substrate and the third substrate, respectively.

In an embodiment, the first electrode layer includes plural first electrode patterns, and the second electrode layer includes plural second electrode patterns. When the sensing circuit layer is electrically conducted, plural electric fields between the plural first electrode patterns and the plural second electrode patterns are generated. As the keycap is moved to a position near a corresponding electric field, the corresponding electric field is changed, so that the non-contact key signal is generated by the sensing circuit layer.

In an embodiment, the illuminated keyboard further includes a reflective plate. The reflective plate is arranged between the light guide plate and the sensing circuit layer, or the reflective plate is disposed under the sensing circuit layer.

In an embodiment, the illuminated keyboard further includes a reflective layer. The reflective layer is disposed over or under the sensing circuit layer.

In an embodiment, the illuminated keyboard further includes a metallic base plate. The metallic base plate is disposed under the sensing circuit layer.

In an embodiment, the illuminated keyboard further includes a buffer layer. The buffer layer is formed on the light guide plate.

In an embodiment, a refractive index of the buffer layer is in a range between 1 and a refractive index of the guide plate.

In an embodiment, the illuminated keyboard further includes a light-shading layer. The light-shading layer is disposed over the buffer layer.

In an embodiment, the light-emitting element is located at a side of the light guide plate.

In an embodiment, the illuminated keyboard further includes plural light-guiding structures. The plural light-guiding structures are formed on the light guide plate corresponding to the keycap. The light beam from the light-emitting element is guided by the plural light-guiding structures to be projected onto the keycap.

In an embodiment, the keycap includes a light-outputting region.

In an embodiment, the illuminated keyboard further includes an elastic element. The elastic element is arranged between the keycap and the light guide plate for providing an elastic force to the keycap. The elastic element is light-transmissible.

In an embodiment, the illuminated keyboard further includes a conductive structure. The conductive structure is formed on an inner surface of the keycap.

In an embodiment, the conductive structure is a metallic paint film or a conductive foam structure.

In an embodiment, the keycap guiding frame includes at least one hollow portion. The keycap is movable within the hollow portion.

In an embodiment, the sensing circuit layer is a capacitive sensing circuit layer.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 1:
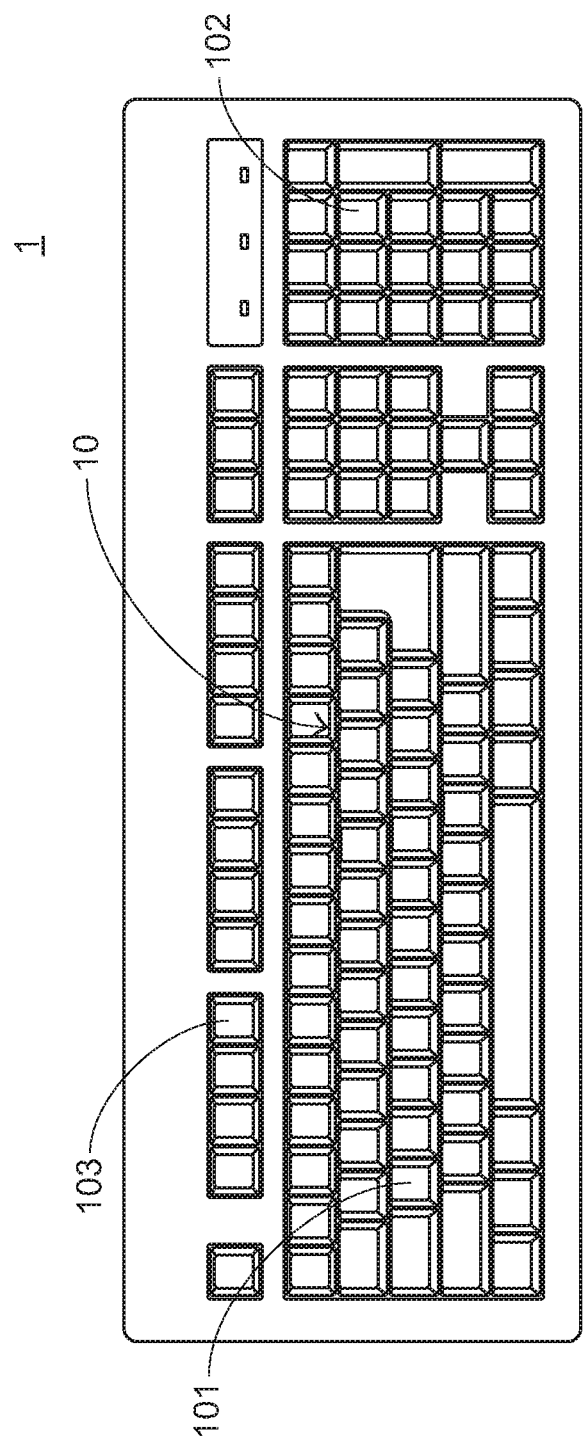
FIG. 1 is a schematic top view illustrating the outward appearance of a conventional keyboard.
Figure 2:
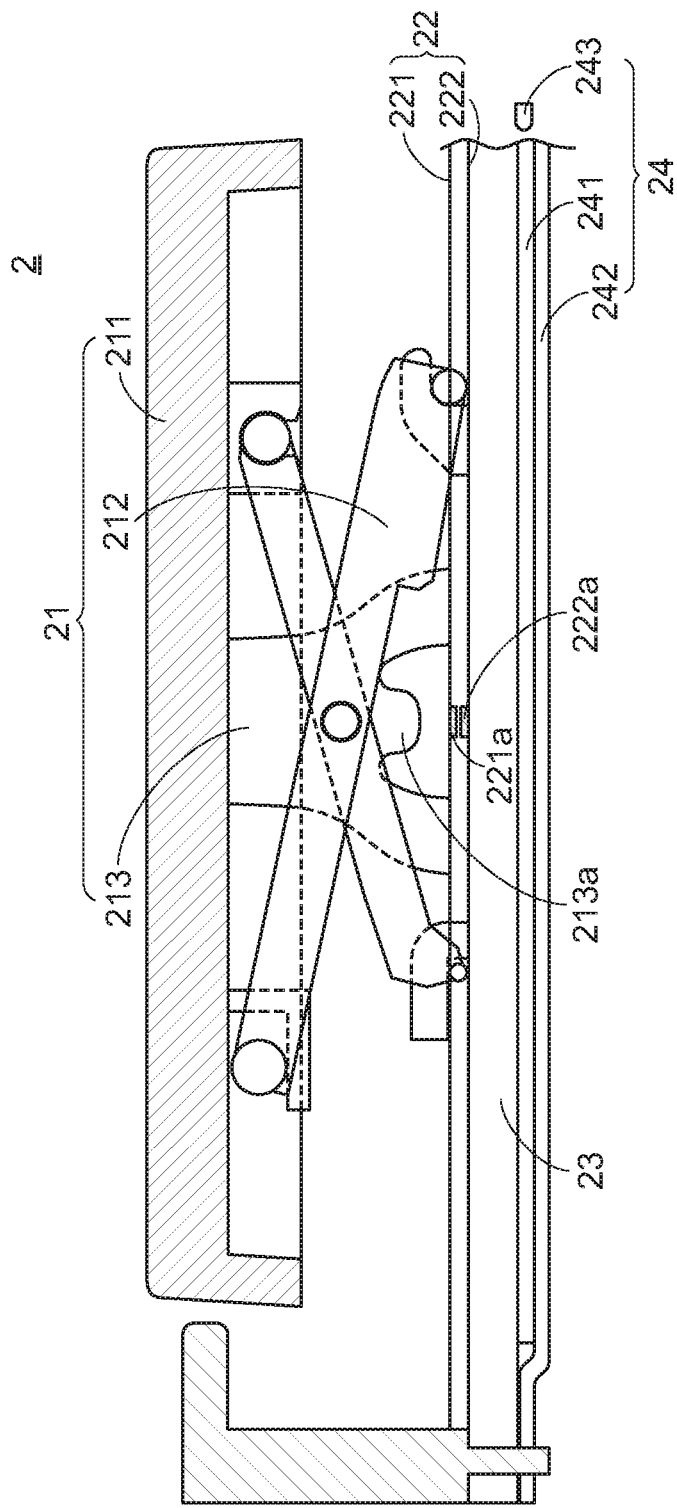
FIG. 2 is a schematic cross-sectional view illustrating a conventional illuminated keyboard.
Figure 3A:
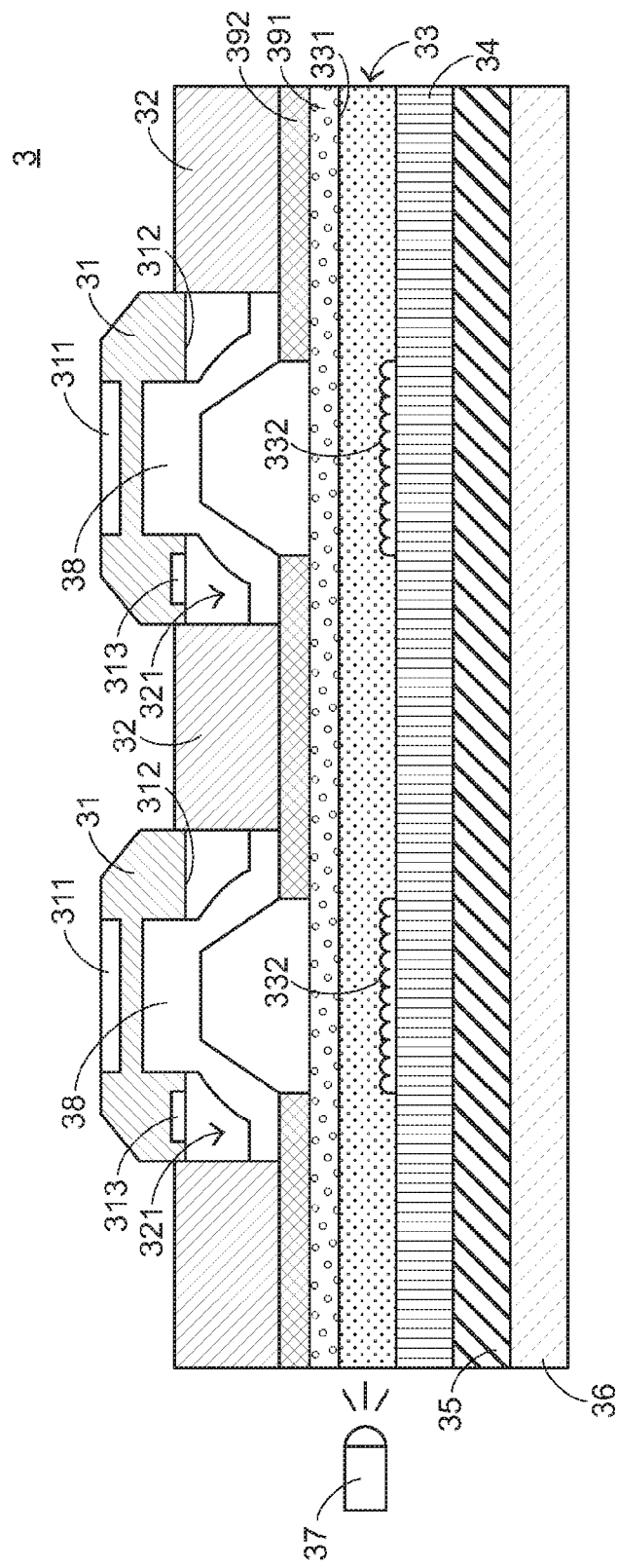
FIG. 3A is a schematic cross-sectional view illustrating an illuminated keyboard according to a first embodiment of the present invention.
Figure 3B:
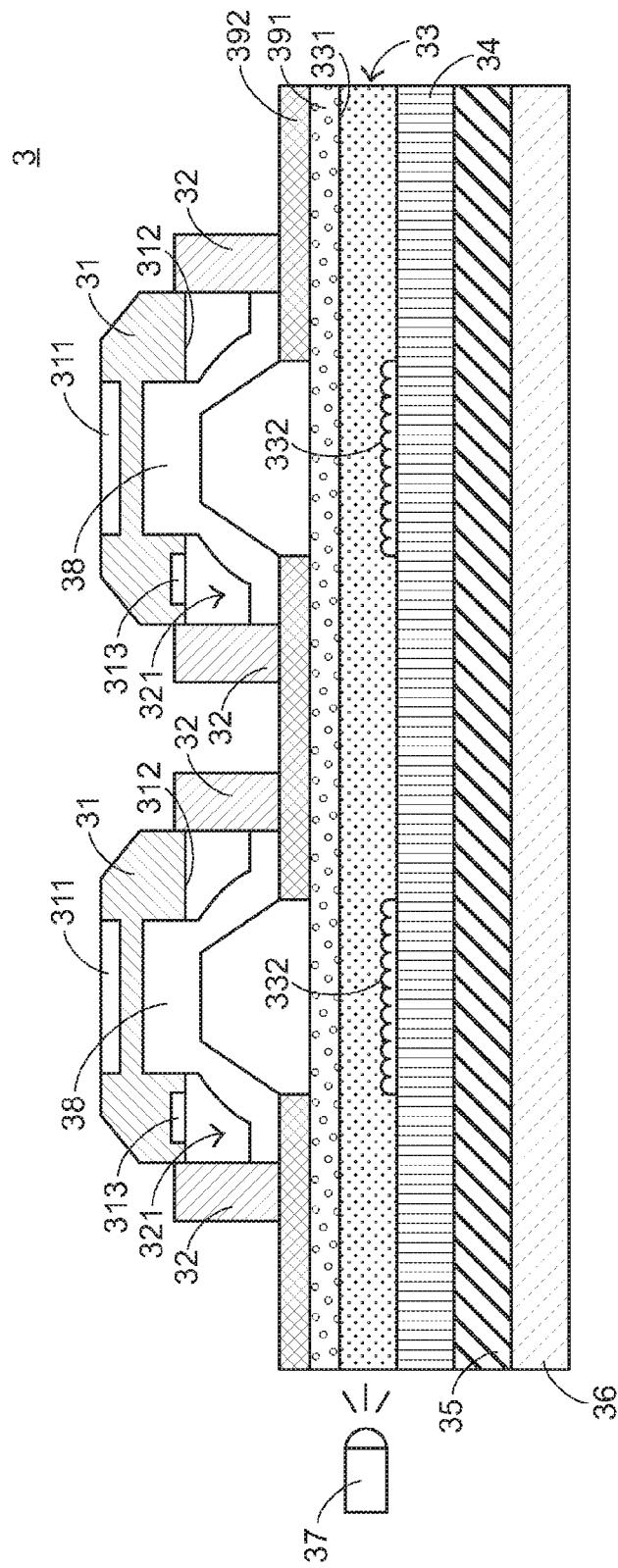
FIG. 3B is a schematic cross-sectional view illustrating a variant of the illuminated keyboard according to the first embodiment of the present invention.

Hereinafter, the configurations of an illuminated keyboard according to a first embodiment of the present invention will be illustrated with reference to FIGS. 3A and 3B. FIG. 3A is a schematic cross-sectional view illustrating an illuminated keyboard according to a first embodiment of the present invention. FIG. 3B is a schematic cross-sectional view illustrating a variant of the illuminated keyboard according to the first embodiment of the present invention.

In FIGS. 3A and 3B, a keycap 31, a keycap guiding frame 32, a light guide plate 33, a reflective plate 34, a sensing circuit layer 35 and a metallic base plate 36 of the illuminated keyboard 3 are sequentially arranged from top to bottom.

Moreover, the illuminated keyboard 3 further comprises a light-emitting element 37 and an elastic element 38. The light-emitting element 37 is located at a side of the light guide plate 33. The elastic element 38 is arranged between the keycap 31 and the light guide plate 33.

The structures of the components of the illuminated keyboard 3 and the relationships between these components will be illustrated as follows. Firstly, the keycap 31 has a light-outputting region 311. The light-outputting region 311 is located at the position corresponding to a character region or a symbol region of the keycap 31.

Moreover, a conductive structure 313 is formed on an inner surface 312 of the keycap 31. In this embodiment, the conductive structure 313 is a metallic paint film coated on the inner surface 312 of the keycap 31 or a conductive foam structure fixed on the inner surface 312 of the keycap 31, but is not limited thereto.

Moreover, the keycap guiding frame 32 has a hollow portion 321. The keycap 31 is fixed in the hollow portion 321 of the keycap guiding frame 32. In addition, the keycap 31 is movable upwardly or downwardly within the hollow portion 321.

As shown in FIG. 3A, the keycap guiding frame 32 is an integral sheet-like body. That is, the keycap guiding frame 32 is shared by plural keycaps 31. Moreover, the keycap guiding frame 32 has plural hollow portions 321 under the plural keycaps 31 for accommodating the plural keycaps 31, respectively. Alternatively, in the variant example of FIG. 3B, the illuminated keyboard 3 comprises plural keycap guiding frames 32. Each keycap guiding frame 32 is disposed under a corresponding keycap 31. Moreover, each keycap guiding frame 32 has a corresponding hollow portion 321 for accommodating the corresponding keycap 31.

The elastic element 38 is disposed under the keycap 31. As the elastic element 38 is pressed by the keycap 31 and moved downwardly, the elastic element 38 generates an elastic force. In response to the elastic force, the keycap 31 may be returned to an original position where the keycap 31 is not depressed. In this embodiment, the elastic element 38 is made of a transparent material, so that the elastic element 38 is light-transmissible.

As long as the elastic element 38 is able to provide the elastic force to the keycap 31 and the influence of the elastic element 38 on the light beam from the light-emitting element 37 is minimized, the shape of the elastic element 38 is not restricted.

Moreover, the light guide plate 33 is disposed under the keycap guiding frame 32 and connected with the elastic element 38. The light guide plate 33 is used for transferring the light beam from the light-emitting element 37.

In this embodiment, the light-emitting element 37 is a light emitting diode (LED). The light guide plate 33 is made of a transparent material. An example of the transparent material includes but is not limited to polycarbonate (PC), polymethylmethacrylate (PMMA), polyethylene terephthalate (PET) or silicone.

Moreover, a buffer layer 391 is formed on a top surface 331 of the light guide plate 33, and a light-shading layer 392 is disposed over the buffer layer 391. The buffer layer 391 is used for separating the light guide plate 33 from the light-shading layer 392. Due to the buffer layer 391, the light beam within the light guide plate 33 is subjected to total internal reflection and transferred within the light guide plate 33, and the light beam from the light-emitting element 37 is not absorbed by the light-shading layer 392.

It is noted that the light-shading layer 392 is not formed on the region where the light beam needs to go through. In this embodiment, the light-shading layer 392 is not formed on the region which is directly disposed over the top surface 331 of the light guide plate 33 and aligned with the corresponding keycap 31. Consequently, the light beam from the light-emitting element 37 and transferred within the light guide plate 33 can be projected upwardly onto the keycap 31.

It is noted that the distribution range of the buffer layer 391 is not restricted. The buffer layer 391 as shown in FIG. 3A or 3B is presented herein for purpose of illustration and description only.

Moreover, it is preferred that the buffer layer 391 is made of a material with low absorptivity and low emissivity to the light beam. Due to the low absorptivity and low emissivity, the adverse influence of the buffer layer 391 on the light-transferring efficacy of the light guide plate 33 will be minimized. According to the principle of the total internal reflection of light, the refractive index of the buffer layer 391 should be lower than the refractive index of the light guide plate 33 in order to assure that the light beam within the light guide plate 33 is possibly subjected to the total internal reflection.

For example, in a case that the light guide plate 33 is made of polycarbonate, the refractive index of the buffer layer 391 should be in the range between 1 (i.e. the refractive index of air) and 1.5872 (i.e. the refractive index of polycarbonate).

If the refractive index of the buffer layer 391 is closer to 1, the ratio between the refractive index of the buffer layer 391 and the refractive index of the light guide plate 33 is smaller. Under this circumstance, the critical angle for resulting in the total internal reflection becomes smaller, and thus the light beam is subjected to the total internal reflection more easily. In other words, if the refractive index of the buffer layer 391 is closer to the refractive index of air, the efficacy of transferring the light beam by the light guide plate 33 is enhanced.

Moreover, in this embodiment, plural light-guiding structures 332 are formed on a bottom surface of the light guide plate 33. By the plural light-guiding structures 332, the light beam from the light-emitting element 37 and transferred within the light guide plate 33 can be transmitted upwardly through the light guide plate 33 more smoothly. That is, by the plural light-guiding structures 332, the light beam from the light-emitting element 37 can be guided to be projected onto the keycap 31.

In accordance with the present invention, the plural light-guiding structures 332 of the light guide plate 33 are produced by a printing method or a non-printing method.

For example, in the printing method, a screen printing process is performed for printing light-guiding ink on the light guide plate 33 to produce the plural light-guiding structures 332 with different shapes and distribution ranges. In the non-printing method, a chemical etching process or a laser engraving process is firstly performed to design a mold and then an injection molding process or a hot embossing process is performed to form the plural light-guiding structures 332 on the light guide plate 33.

It is noted that the plural light-guiding structures 332 as shown in FIG. 3 are presented herein for purpose of illustration and description only. However, those skilled in the art will readily observe that the shape, the forming method and the distribution range of the plural light-guiding structures 332 may be varied according to the practical requirements.

Moreover, the plural light-guiding structures 332 are disposed under the keycap 31. Due to the plural light-guiding structures 332, the light beam from the light-emitting element 37 is scattered and guided to the light-outputting region 311 of the keycap 31. Consequently, the light beam can be outputted from the character region or the symbol region of the keycap 31 to achieve the illuminating purpose.

In some embodiments, after the buffer layer 391 or the light-shading layer 392 is formed on the top surface 331 of the light guide plate 33, the keycap guiding frame 32 and the elastic element 38 are fixed over the light guide plate 33. That is, when the keycap guiding frame 32 and the elastic element 38 are fixed over the light guide plate 33, the keycap guiding frame 32 and the elastic element 38 may be contacted with the buffer layer 391 or the light-shading layer 392. It is noted that the combination between the keycap guiding frame 32 and the elastic element 38 and the light guide plate 33 as shown in FIG. 3A or 3B is presented herein for purpose of illustration and description only.

Moreover, the reflective plate 34 is disposed under the light guide plate 33 for increasing the reflectivity to the light beam and reducing the leakage percentage of the light beam. By means of the reflective plate 34, the luminance of the illuminated keyboard 3 can be enhanced.

Moreover, the sensing circuit layer 35 is disposed under the reflective plate 34 for sensing whether the keycap 31 is depressed by the user or not. If the depressing action of the keycap 31 is sensed by the sensing circuit layer 35, the sensing circuit layer 35 generates a corresponding non-contact key signal. According to the non-contact key signal, a corresponding function (e.g. a function of inputting a character, a symbol or a number into a computer system) is executed.

Figure 4A:
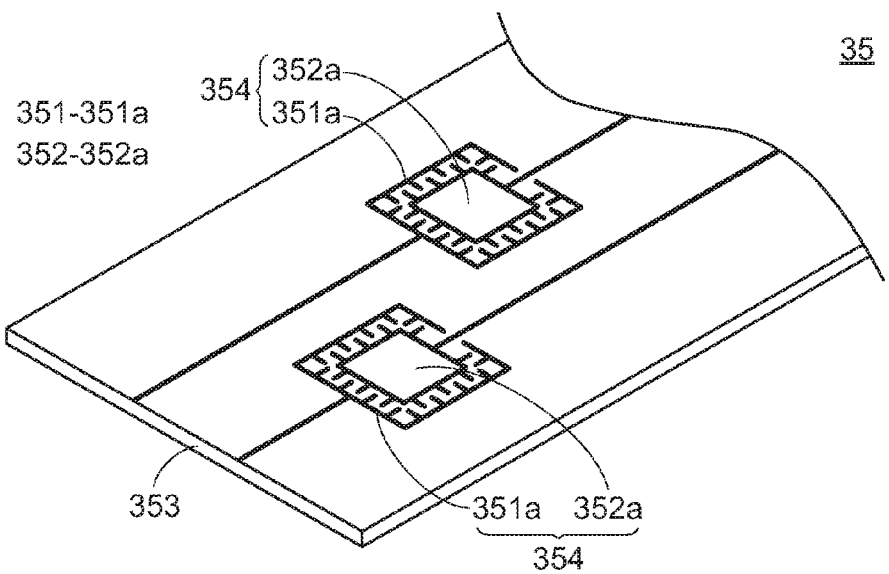
FIG. 4A is a schematic partial perspective view illustrating the outward appearance of a first exemplary sensing circuit layer used in the illuminated keyboard according to the first embodiment of the present invention.

In this embodiment, the sensing circuit layer 35 is a capacitive sensing circuit layer. Hereinafter, two exemplary sensing circuit layers 35 will be illustrated. A first exemplary sensing circuit layer 35 will be illustrated with reference to FIGS. 3A and 4A. FIG. 4A is a schematic partial perspective view illustrating the outward appearance of a first exemplary sensing circuit layer used in the illuminated keyboard according to the first embodiment of the present invention. It is noted that the sensing circuit layer 35 as shown in FIG. 4A is presented herein for purpose of illustration and description only. However, those skilled in the art will readily observe that the forming method and the pattern of the sensing circuit layer 35 may be varied according to the practical requirements.

As shown in FIG. 4A, the sensing circuit layer 35 comprises a first electrode layer 351, a second electrode layer 352, and a first substrate 353. The first electrode layer 351 and the second electrode layer 352 are sequentially formed on the first substrate 353.

The first electrode layer 351 comprises plural first electrode patterns 351a. The second electrode layer 352 comprises plural second electrode patterns 352a. The plural second electrode patterns 352a are located beside the plural first electrode patterns 351a, respectively.

In this embodiment, each of the plural first electrode patterns 351a and the corresponding second electrode pattern 352a are collaboratively defined as a key switch 354. Each key switch 354 is aligned with the corresponding keycap 31.

In this embodiment, the first electrode layer 351 and the second electrode layer 352 are made of an electrically-conductive material. An example of the electrically-conductive material includes but is not limited to indium tin oxide (ITO), indium zinc oxide, aluminum zinc oxide, conductive polymeric material, graphene, silver bromide (AgBr), indium gallium zinc oxide (IGZO), carbon nanotube, nano silver or nano Cu.

When the sensing circuit layer 35 is electrically conducted, plural electric fields between the first electrode patterns 351a and the corresponding second electrode patterns 352a of the key switches 354 are generated. As one of the keycap 31 is depressed by the user, the conductive structure 313 on the inner surface 312 of the keycap 31 is moved to a position near the underlying and corresponding electric field. Under this circumstance, the corresponding electric field is changed. Due to the change of the corresponding electric field, a controller (not shown) generates a corresponding non-contact key signal.

Figure 4B:
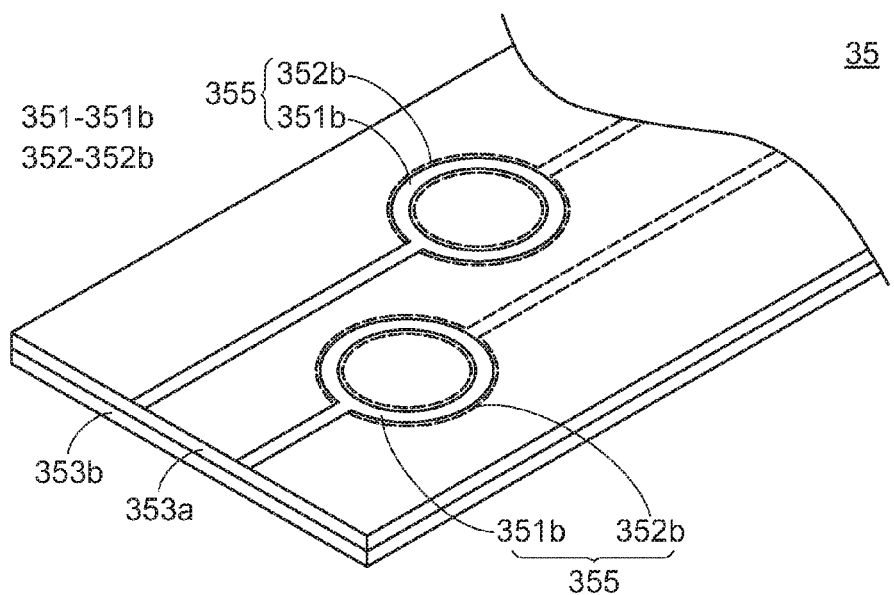
FIG. 4B is a schematic partial perspective view illustrating the outward appearance of a second exemplary sensing circuit layer used in the illuminated keyboard according to the first embodiment of the present invention.

A second exemplary sensing circuit layer 35 will be illustrated with reference to FIGS. 3A and 4B. FIG. 4B is a schematic partial perspective view illustrating the outward appearance of a second exemplary sensing circuit layer used in the illuminated keyboard according to the first embodiment of the present invention. It is noted that the sensing circuit layer 35 as shown in FIG. 4B is presented herein for purpose of illustration and description only. However, those skilled in the art will readily observe that the forming method and the pattern of the sensing circuit layer 35 may be varied according to the practical requirements.

As shown in FIG. 4B, the sensing circuit layer 35 comprises a first electrode layer 351, a second electrode layer 352, a second substrate 353a, and a third substrate 353b. The first electrode layer 351 and the second electrode layer 352 are formed on the second substrate 353a and the third substrate 353b, respectively.

In this embodiment, the first electrode layer 351 is formed on a bottom surface of the second substrate 353a, and the second electrode layer 352 is formed on a top surface of the third substrate 353b, but is not limited thereto.

The first electrode layer 351 comprises plural first electrode patterns 35 1b. The second electrode layer 352 comprises plural second electrode patterns 352b, which are indicated by dotted lines. The plural second electrode patterns 352b are located beside the plural first electrode patterns 351b, respectively.

In this embodiment, each of the plural first electrode patterns 351b and the corresponding second electrode pattern 352b are collaboratively defined as a key switch 355. Each key switch 355 is aligned with the corresponding keycap 31.

When the sensing circuit layer 35 is electrically conducted, plural electric fields between the first electrode patterns 351b and the corresponding second electrode patterns 352b of the key switches 355 are generated. As one of the keycap 31 is depressed by the user, the conductive structure 313 on the inner surface 312 of the keycap 31 is moved to a position near the underlying and corresponding electric field. Under this circumstance, the corresponding electric field is changed. Due to the change of the corresponding electric field, a controller (not shown) generates a corresponding non-contact key signal.

Afterwards, the metallic base plate 36 is disposed under the sensing circuit layer 35 for supporting the above components and increasing the overall structural strength of all components of the illuminated keyboard 3.

It is noted that the metallic base plate 36 is not an essential component. If the illuminated keyboard 3 has sufficient overall structural strength, the metallic base plate 36 may be omitted.

Figure 5:
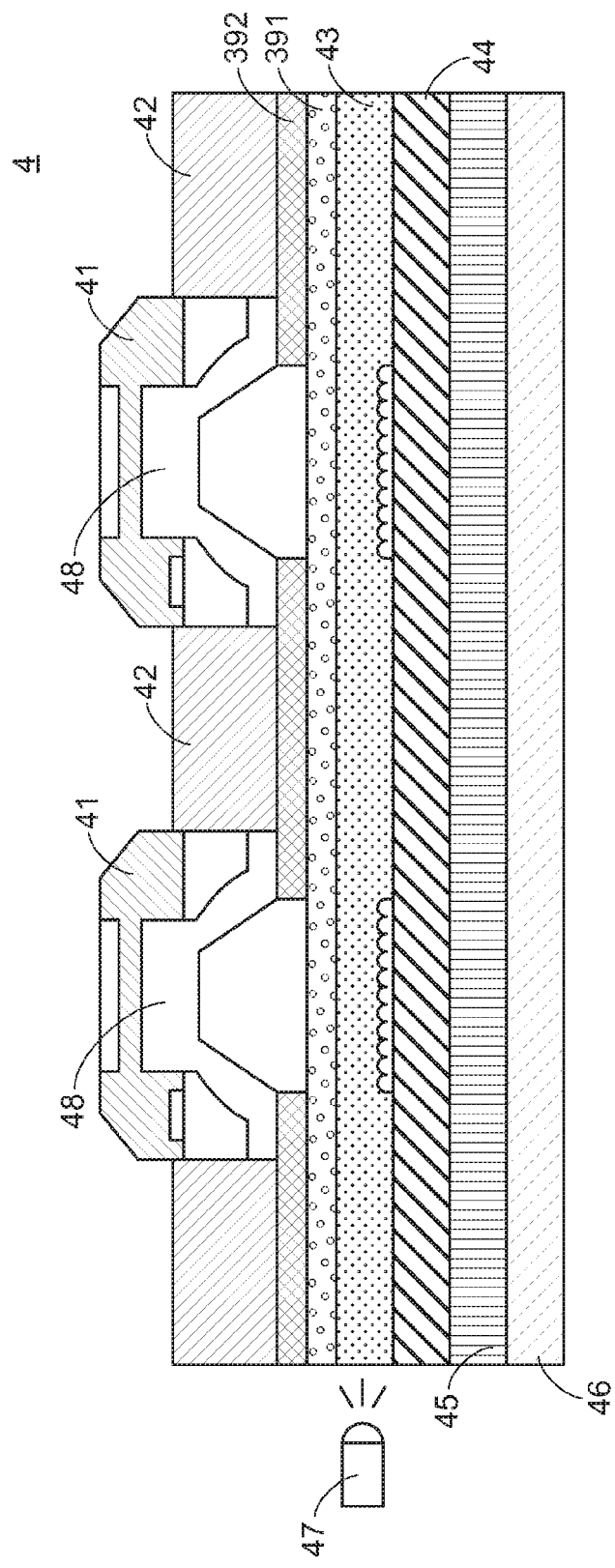
FIG. 5 is a schematic cross-sectional view illustrating an illuminated keyboard according to a second embodiment of the present invention.

The present invention further provides an illuminated keyboard of a second embodiment. FIG. 5 is a schematic cross-sectional view illustrating an illuminated keyboard according to a second embodiment of the present invention.

In FIG. 5, a keycap 41, a keycap guiding frame 42, a light guide plate 43, a sensing circuit layer 44, a reflective plate 45 and a metallic base plate 46 of the illuminated keyboard 4 are sequentially arranged from top to bottom. Moreover, the illuminated keyboard 4 further comprises a light-emitting element 47 and an elastic element 48. The light-emitting element 47 is located at a side of the light guide plate 43. The elastic element 48 is arranged between the keycap 41 and the light guide plate 43.

The structures and materials of the components of the illuminated keyboard 4 are similar to those of the illuminated keyboard 3 of first embodiment, and are not redundantly described herein.

In comparison with the first embodiment, the reflective plate 45 of the illuminated keyboard 4 is disposed under the sensing circuit layer 44. Due to the reflective plate 45, the leakage percentage of the light beam that is emitted by the light-emitting element 47 and transferred within the light guide plate 43 will be reduced. Consequently, the luminance of the illuminated keyboard 4 is increased.

Figure 6:
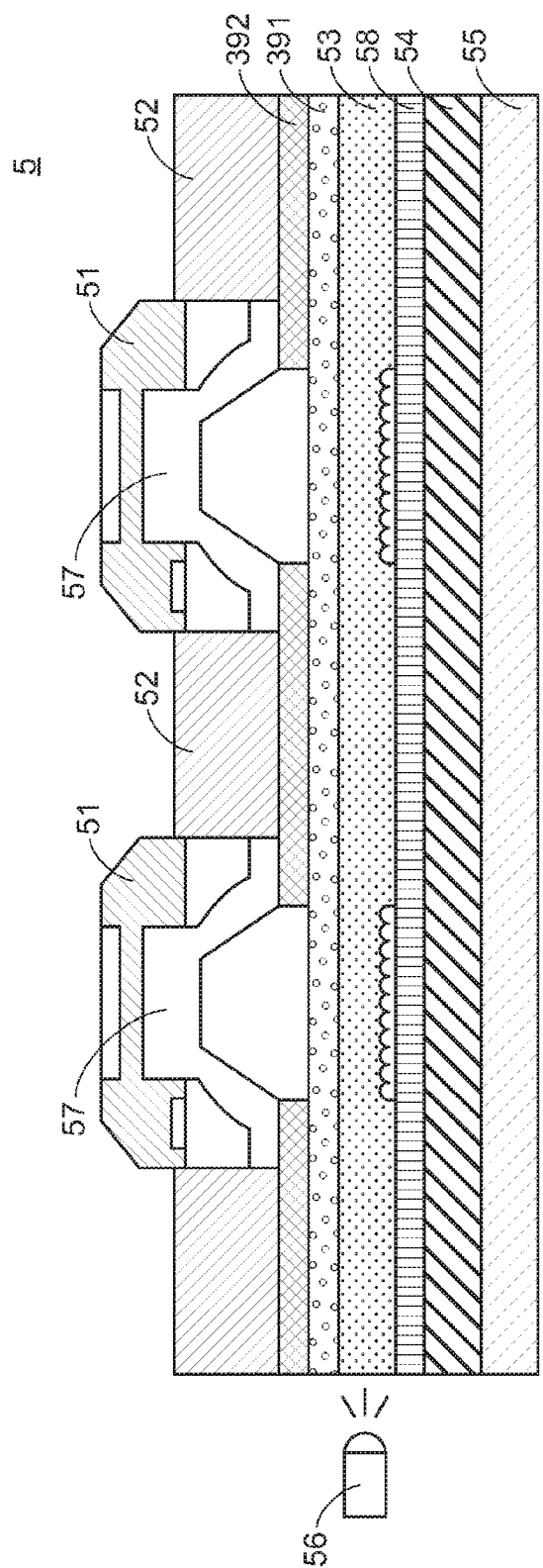
FIG. 6 is a schematic cross-sectional view illustrating an illuminated keyboard according to a third embodiment of the present invention.
Figure 7:
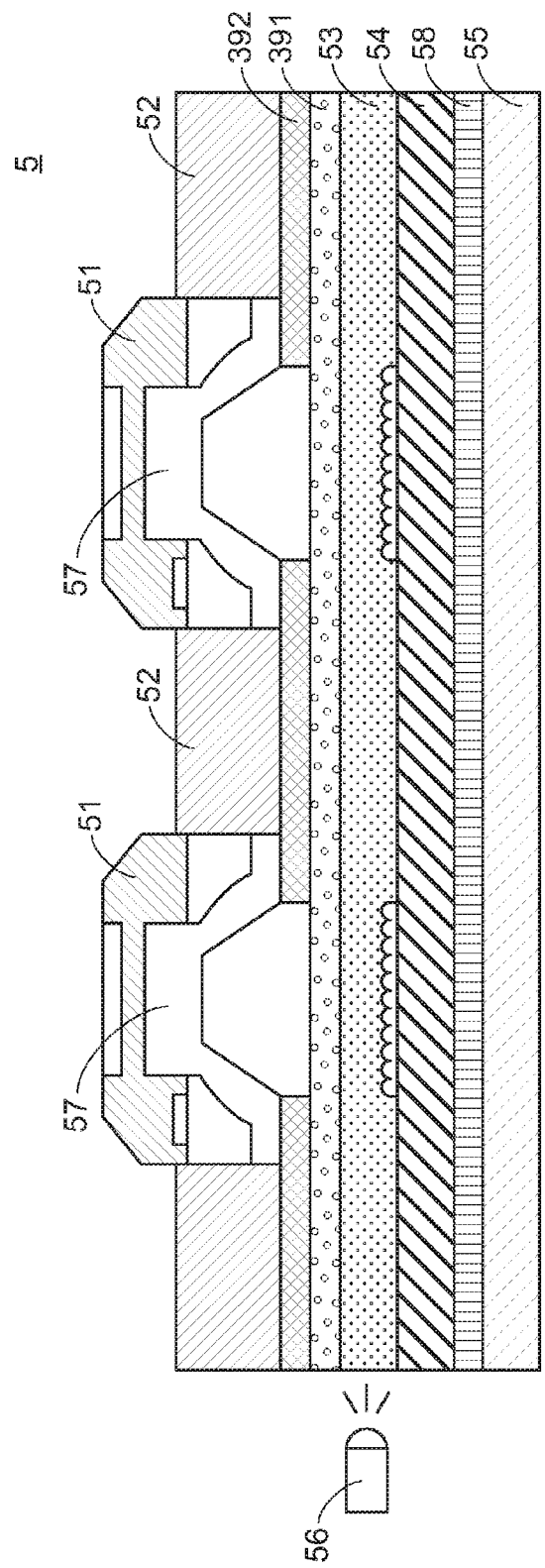
FIG. 7 is a schematic cross-sectional view illustrating an illuminated keyboard according to a fourth embodiment of the present invention.

Hereinafter, an illuminated keyboard of a third embodiment and an illuminated keyboard of a fourth embodiment will be illustrated with reference to FIGS. 6 and 7. FIG. 6 is a schematic cross-sectional view illustrating an illuminated keyboard according to a third embodiment of the present invention. FIG. 7 is a schematic cross-sectional view illustrating an illuminated keyboard according to a fourth embodiment of the present invention.

In FIGS. 6 and 7, a keycap 51, a keycap guiding frame 52, a light guide plate 53, a sensing circuit layer 54 and a metallic base plate 55 of the illuminated keyboard 5 are sequentially arranged from top to bottom. Moreover, the illuminated keyboard 5 further comprises a light-emitting element 56 and an elastic element 57. The light-emitting element 56 is located at a side of the light guide plate 53. The elastic element 57 is arranged between the keycap 51 and the light guide plate 53.

The structures and materials of the components of the illuminated keyboard 5 are similar to those of the illuminated keyboard 3 of first embodiment, and are not redundantly described herein.

In comparison with the first embodiment and the second embodiment, a reflective layer 58 of the illuminated keyboard 5 is distributed and formed on a top surface of the sensing circuit layer 54 (see FIG. 6), or the reflective layer 58 is distributed and formed on a bottom surface of the sensing circuit layer 54 (see FIG. 7). Due to the reflective layer 58, the leakage percentage of the light beam that is emitted by the light-emitting element 56 and transferred within the light guide plate 53 will be reduced.

From the above descriptions, the present invention provides an illuminated keyboard. The illuminated keyboard has a non-contact sensing circuit layer for sensing whether the keycap is depressed by the user or not. In other words, the conventional elastic element with the protrusion part (e.g. a rubber dome) for pressing the membrane switch circuit module is not included in the illuminated keyboard of the present invention. Moreover, since a keycap guiding frame is used for fixing the keycap and guiding movement of the keycap, the upward/downward supporting member (i.e. the scissors-type supporting member) used in the conventional illuminated keyboard is omitted. Consequently, when the light beam from the light-emitting element is projected upwardly onto the keycap, the light beam is not obviously absorbed by other components or the propagating direction of the light beam is not obviously changed. Under this circumstance, the light beam can be projected onto the keycap more uniformly.

More especially, since the light guide plate of the illuminated keyboard of the present invention also provides the function of fixing the keycap guiding frame, it is not necessary to install an additional substrate for fixing the keycap guiding frame. Consequently, the overall thickness of the illuminated keyboard is largely reduced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An illuminated keyboard, comprising:
at least one keycap including a conductive structure;
at least one light-emitting element for providing a light beam to said keycap;
a light guide plate for transferring said light beam from said light-emitting element;
a sensing circuit layer disposed under said light guide plate and including at least one pair of first electrode layer and second electrode layer, between which an electric field is generated; and
at least one keycap guiding frame disposed on said light guide plate for connecting said keycap and said light guide plate, wherein said keycap guiding frame is disposed and in contact with said keycap for guiding a movement of said keycap,
wherein said pair of first and second electrode layers of said sensing layer aligns with said conductive structure of said keycap, and in response to said movement of said keycap along said keycap guiding frame toward said sensing circuit layer, said electric field changes so as to have a non-contact key signal generated from said sensing circuit layer.

2. The illuminated keyboard according to claim 1, wherein said first electrode layer and said second electrode layer are formed on the same substrate.

3. The illuminated keyboard according to claim 2, wherein said first electrode layer comprises plural first electrode patterns, and said second electrode layer comprises plural second electrode patters, wherein when said sensing circuit layer is electrically conducted, plural electric fields between said plural first electrode patterns and said plural second electrode patterns are generated, wherein as said keycap is moved to a position near a corresponding electric field, said corresponding electric fields is changed, so that said non-contact key signal is generated by said sensing circuit layer.

4. The illuminated keyboard according to claim 1, wherein said first electrode layer and said second electrode layer are formed on different substrates.

5. The illuminated keyboard according to claim 4, wherein said first electrode layer comprises plural first electrode patterns, and said second electrode layer comprises plural second electrode patterns, wherein when said sensing circuit layer is electrically conducted, plural electric fields between said plural first electrode patterns and said plural second electrode patterns are generated, wherein as said keycap is moved to a position near a corresponding electric field, said corresponding electric field is changed, so that said non-contact key signal is generated by said sensing circuit layer.

6. The illuminated keyboard according to claim 1, further comprising a reflective plate, wherein said reflective plate is arranged between said light guide plate and said sensing circuit layer, or said reflective plate is disposed under said sensing circuit layer.

7. The illuminated keyboard according to claim 1, further comprising a reflective layer, wherein said reflective layer is disposed over or under said sensing circuit layer.

8. The illuminated keyboard according to claim 1, further comprising a metallic base plate, wherein said metallic base plate is disposed under said sensing circuit layer.

9. The illuminated keyboard according to claim 1, further comprising a buffer layer, wherein said buffer layer is formed on said light guide plate.

10. The illuminated keyboard according to claim 9, wherein a refractive index of said buffer layer is in a range between 1 and a refractive index of said guide plate.

11. The illuminated keyboard according to claim 9, further comprising a light-shading layer, wherein said light-shading layer is disposed over said buffer layer.

12. The illuminated keyboard according to claim 1, wherein said light-emitting element is located at a side of said light guide plate.

13. The illuminated keyboard according to claim 1, further comprising plural light-guiding structures, wherein said plural light-guiding structures are formed on said light guide plate corresponding to said keycap, wherein said light beam from said light-emitting element is guided by said plural light-guiding structures to be projected onto said keycap.

14. The illuminated keyboard according to claim 1, wherein said keycap comprises a light-outputting region.

15. The illuminated keyboard according to claim 1, further comprising an elastic element, wherein said elastic element is arranged between said keycap and said light guide plate for providing an elastic force to said keycap, wherein said elastic element is light-transmissible.

16. The illuminated keyboard according to claim 1, wherein said conductive structure is formed on an inner surface of said keycap.

17. The illuminated keyboard according to claim 16, wherein said conductive structure is a metallic paint film or a conductive foam structure.

18. The illuminated keyboard according to claim 1, wherein said keycap guiding frame comprises at least one hollow portion, wherein said keycap is movable within said hollow portion.

19. The illuminated keyboard according to claim 1, wherein said sensing circuit layer is a capacitive sensing circuit layer.

* * * * *